US011120966B2

(12) United States Patent
Chang et al.

(10) Patent No.: US 11,120,966 B2
(45) Date of Patent: Sep. 14, 2021

(54) SYSTEM AND METHOD FOR IMPROVED BEAM CURRENT FROM AN ION SOURCE

(71) Applicant: Applied Materials, Inc., Santa Clara, CA (US)

(72) Inventors: Shengwu Chang, Hamilton, MA (US); Frank Sinclair, Boston, MA (US); Michael St. Peter, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/734,979

(22) Filed: Jan. 6, 2020

(65) Prior Publication Data

US 2021/0066019 A1 Mar. 4, 2021

Related U.S. Application Data

(60) Provisional application No. 62/895,235, filed on Sep. 3, 2019.

(51) Int. Cl.
*H01J 37/08* (2006.01)
(52) U.S. Cl.
CPC ......... *H01J 37/08* (2013.01); *H01J 2237/006* (2013.01)
(58) Field of Classification Search
CPC .. H01J 37/08; H01J 2237/006; H01J 2237/02; H01J 2237/0206
See application file for complete search history.

(56) References Cited

U.S. PATENT DOCUMENTS 5,089,746 A * 2/1992 Rosenblum ............. H01J 37/08
204/298.01
5,852,345 A * 12/1998 Armini ................... H01J 27/08
315/111.81

(Continued)

FOREIGN PATENT DOCUMENTS

CN       1428001 A     7/2003
CN     101285167 A    10/2008

(Continued)

OTHER PUBLICATIONS

Office action dated Apr. 27, 2021 in co-pending U.S. Appl. No. 16/735,053.

(Continued)

*Primary Examiner* — Sean M Luck
(74) *Attorney, Agent, or Firm* — Nields, Lemack & Frame, LLC (57) ABSTRACT

An IHC ion source that employs a negatively biased cathode and one or more side electrodes is disclosed. The one or more side electrodes are biased using an electrode power supply, which supplies a voltage of between 0 and −50 volts, relative to the chamber. By adjusting the output from the electrode power supply, beam current can be optimized for different species. For example, certain species, such as arsenic, may be optimized when the side electrodes are at the same voltage as the chamber. Other species, such as boron, may be optimized when the side electrodes are at a negative voltage relative to the chamber. In certain embodiments, a controller is in communication with the electrode power supply so as to control the output of the electrode power supply, based on the desired feed gas.

16 Claims, 4 Drawing Sheets

(56) References Cited

U.S. PATENT DOCUMENTS

| | | | |
|---|---|---|---|
| 6,335,535 B1 | 1/2002 | Miyake et al. | |
| 6,777,686 B2 | 8/2004 | Olson et al. | |
| 7,102,139 B2 | 9/2006 | Low et al. | |
| 7,446,326 B2* | 11/2008 | Chaney | H01J 37/08 |
| | | | 250/492.1 |
| 8,253,114 B2 | 8/2012 | Yamashita et al. | |
| 8,263,944 B2 | 9/2012 | Koo et al. | |
| 9,691,584 B1 | 6/2017 | Tieger et al. | |
| 9,818,570 B2 | 11/2017 | Alvarado et al. | |
| 10,290,461 B1 | 5/2019 | Tieger et al. | |
| 10,896,799 B1 | 1/2021 | Becker et al. | |
| 2001/0042836 A1 | 11/2001 | Olson et al. | |
| 2002/0162508 A1* | 11/2002 | Dykstra | H01J 37/08 |
| | | | 118/723 CB |
| 2003/0094902 A1 | 5/2003 | Yamashita | |
| 2007/0152165 A1 | 7/2007 | Kim et al. | |
| 2007/0194252 A1 | 8/2007 | Horsky et al. | |
| 2008/0157681 A1 | 7/2008 | Huang et al. | |
| 2008/0220596 A1* | 9/2008 | Olander | H01J 27/02 |
| | | | 438/514 |
| 2009/0242793 A1 | 10/2009 | Low et al. | |
| 2010/0051825 A1 | 3/2010 | Yamashita et al. | |
| 2010/0148089 A1 | 6/2010 | Horsky et al. | |
| 2011/0139613 A1 | 6/2011 | Ikejiri et al. | |
| 2012/0286152 A1 | 11/2012 | Jones et al. | |
| 2013/0140450 A1* | 6/2013 | Graupera | H01J 37/05 |
| | | | 250/282 |
| 2014/0061501 A1* | 3/2014 | Sinha | H01J 37/08 |
| | | | 250/424 |
| 2014/0127394 A1* | 5/2014 | Gammel | H01J 37/026 |
| | | | 427/8 |
| 2014/0265854 A1 | 9/2014 | Horsky et al. | |
| 2015/0053866 A1* | 2/2015 | Aramaki | G21K 1/14 |
| | | | 250/423 R |
| 2015/0248992 A1* | 9/2015 | Sinha | H01J 37/32807 |
| | | | 250/424 |
| 2016/0247669 A1 | 8/2016 | Tateishi et al. | |
| 2017/0117113 A1* | 4/2017 | Alvarado | H01J 27/024 |
| 2017/0278690 A1* | 9/2017 | Aliman | H01J 49/145 |
| 2017/0292186 A1* | 10/2017 | Reinicker | H01J 37/08 |
| 2018/0247797 A1 | 8/2018 | Gorokhovsky | |
| 2018/0308658 A1* | 10/2018 | Matsubara | H01J 37/08 |
| 2018/0374689 A1 | 12/2018 | Abraham et al. | |
| 2019/0122851 A1 | 4/2019 | Tieger et al. | |
| 2019/0139742 A1 | 5/2019 | McLaughlin et al. | |
| 2019/0180971 A1 | 6/2019 | Becker et al. | |
| 2021/0066017 A1 | 3/2021 | Chang et al. | |

FOREIGN PATENT DOCUMENTS

| | | |
|---|---|---|
| CN | 101661862 A | 3/2010 |
| CN | 101960554 A | 1/2011 |
| CN | 102034665 A | 4/2011 |
| CN | 104051209 A | 9/2014 |
| CN | 105655217 A | 6/2016 |
| JP | 2007-184218 A | 7/2007 |
| JP | 2009-211955 A | 9/2009 |
| JP | 2011-124059 A | 6/2011 |
| JP | 2016-157523 A | 9/2016 |
| KR | 10-2009-0055710 A | 6/2009 |
| TW | 200300949 A | 6/2003 |
| TW | I227906 B | 2/2005 |
| TW | 200947496 A | 11/2009 |
| TW | 201435956 A | 9/2014 |

OTHER PUBLICATIONS

Office action dated Aug. 26, 2020 in co-pending U.S. Appl. No. 16/735,053.
International Search Report and Written Opinion dated Nov. 20, 2020 in corresponding PCT application No. PCT/US2020/045749.
International Search Report and Written Opinion dated Nov. 24, 2020 in co-pending PCT application No. PCT/US2020/045748.
Office action dated Mar. 4, 2020 in co-pending U.S. Appl. No. 16/735,053.
Final rejection dated Feb. 9, 2021 in co-pending U.S. Appl. No. 16/735,053.

* cited by examiner

SYSTEM AND METHOD FOR IMPROVED BEAM CURRENT FROM AN ION SOURCE

FIELD

Embodiments of the present disclosure relate to an ion source, and more particularly, an indirectly heated cathode (IHC) ion source where the voltage applied to the side electrodes may be varied to improve beam current.

BACKGROUND

Various types of ion sources may be used to create the ions that are used in semiconductor processing equipment. One type of ion source is the indirectly heated cathode (IHC) ion source. IHC ion sources operate by supplying a current to a filament disposed behind a cathode. The filament emits thermionic electrons, which are accelerated toward and heat the cathode, in turn causing the cathode to emit electrons into the chamber of the ion source. Since the filament is protected by the cathode, its life may be extended relative to a Bernas ion source. The cathode is disposed at one end of a chamber. A repeller is typically disposed on the end of the chamber opposite the cathode. The cathode and repeller may be biased so as to repel the electrons, directing them back toward the center of the chamber. In some embodiments, a magnetic field is used to further confine the electrons within the chamber.

In certain embodiments of these ion sources, side electrodes are also disposed on one or more walls of the chamber. These side electrodes may be biased so as to control the position of ions and electrons, so as to increase the ion density near the center of the chamber. An extraction aperture is disposed along another side, proximate the center of the chamber, through which the ions may be extracted.

The optimal voltage applied to the cathode, repeller and side electrodes differs, depending on the feed gas that is being used.

Therefore, a system and method that improves the beam current for various species would be beneficial. Further, it would be advantageous if this system were readily adaptable for different species.

SUMMARY

An IHC ion source that employs a negatively biased cathode and one or more side electrodes is disclosed. The one or more side electrodes are biased using an electrode power supply, which supplies a voltage of between 0 and −50 volts, relative to the chamber. By adjusting the output from the electrode power supply, beam current can be optimized for different species. For example, certain species, such as arsenic, may be optimized when the side electrodes are at the same voltage as the chamber. Other species, such as boron, may be optimized when the side electrodes are at a negative voltage relative to the chamber. In certain embodiments, a controller is in communication with the electrode power supply so as to control the output of the electrode power supply, based on the desired feed gas.

According to one embodiment, an ion source is disclosed. The ion source comprises a chamber, comprising at least one electrically conductive wall; a cathode disposed on one end of the chamber; a first side electrode disposed on one side wall; an arc power supply to bias the cathode at a negative voltage relative to the electrically conductive wall; and an electrode power supply to bias the first side electrode, where an output of the electrode power supply is between 0 and −50V relative to the electrically conductive wall. In certain embodiments, the ion source further comprises a controller in communication with the electrode power supply. In some further embodiments, the controller varies the output of the electrode power supply based on a feed gas that is used. In certain embodiments, the controller sets the output of the electrode power supply to 0V if an arsenic-based feed gas is used. In certain embodiments, the controller sets the output of the electrode power supply to a value between −5V and −50V if a boron-based feed gas is used. In some further embodiments, the controller sets the output of the electrode power supply to a value between −8V and −30V if a boron-based feed gas is used. In some embodiments, the controller sets the output of the electrode power supply to a value such that boron fractionalization is at least 15% greater than the boron fractionalization is when the output of the electrode power supply is 0V. In some embodiments, the ion source comprises a second side electrode disposed on a second side wall, wherein the second side electrode is in communication with the electrode power supply. In certain embodiments, the ion source comprises a repeller disposed on an opposite end of the chamber.

According to another embodiment, an ion source is disclosed. The ion source, comprises a chamber, comprising at least one electrically conductive wall; a cathode disposed on one end of the chamber; a first side electrode disposed on one side wall; an arc power supply to bias the cathode at a negative voltage relative to the electrically conductive wall; an electrode power supply to bias the first side electrode; and a controller, comprising an input device through which an operator may enter a desired feed gas, and wherein the controller controls an output of the electrode power supply, such that the output is 0V when a first species of feed gas is selected, and the output is a negative voltage when a second species of feed gas is selected. In some embodiments, the first species comprises an arsenic-based feed gas. In some embodiments, the second species comprises a boron-based feed gas. In certain embodiments, wherein the negative voltage is between −5V and −50V relative to the electrically conductive wall. In certain embodiments, the negative voltage is between −8V and −30V relative to the electrically conductive wall. In certain embodiments, the ion source further comprises a second side electrode disposed on a second side wall, wherein the second side electrode is in communication with the electrode power supply. In some embodiments, the ion source further comprises a repeller disposed on an opposite end of the chamber.

According to another embodiment, an ion source is disclosed. The ion source comprises a chamber, comprising at least one electrically conductive wall; a cathode disposed on one end of the chamber; a first side electrode disposed on one side wall; an arc power supply to bias the cathode at a negative voltage relative to the electrically conductive wall; an electrode power supply to bias the first side electrode; and a switch having two inputs and an output, wherein a first input is in communication with the electrically conductive wall, a second input is in communication with the electrode power supply, and the output is in communication with the first side electrode, such that in a first position, the first side electrode is in electrical communication with the electrode power supply and in a second position, the first side electrode is in electrical communication with the electrically conductive wall. In certain embodiments, the ion source further comprises a controller in communication with a select signal of the switch. In certain embodiments, the controller selects the first position when a first species of feed gas is used and selects the second position when a second species of feed gas is used. In some further embodiments, the first species comprises a boron-based feed gas.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
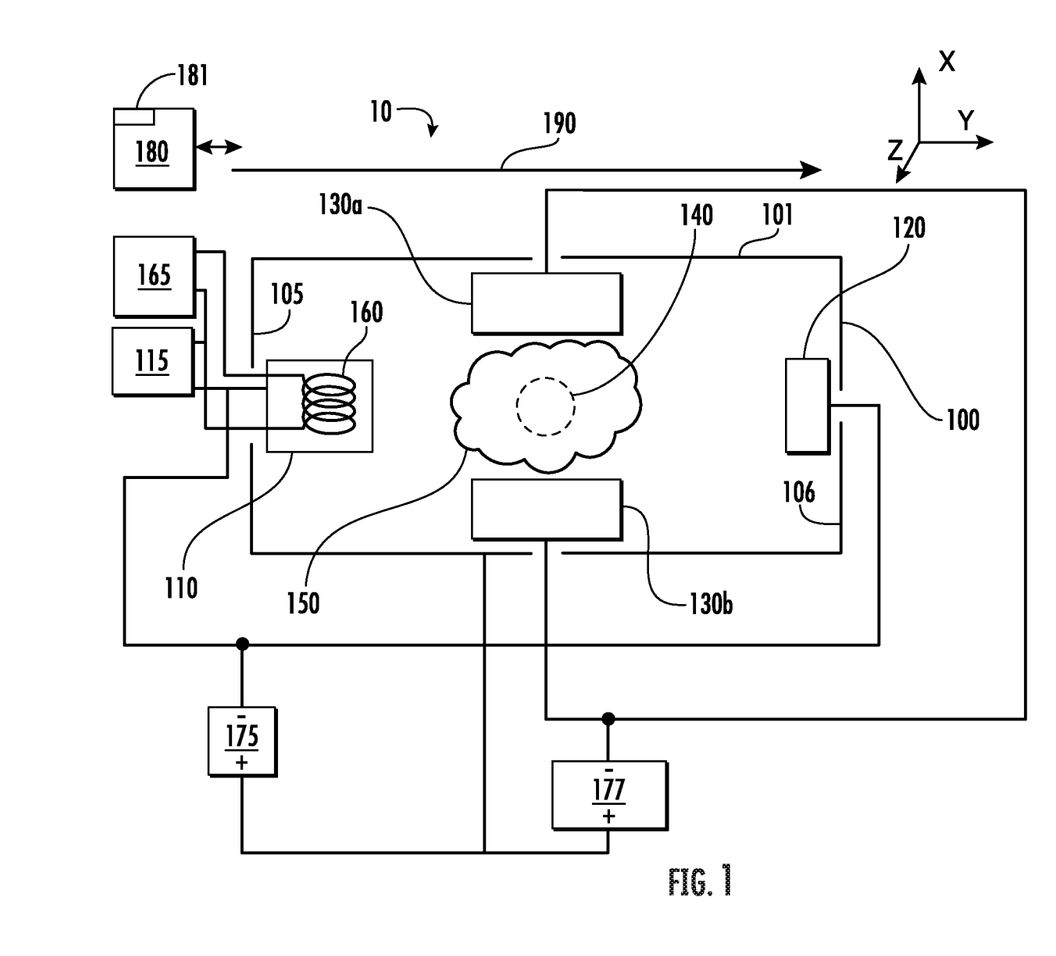
FIG. 1 is an ion source in accordance with one embodiment.
Figure 2:
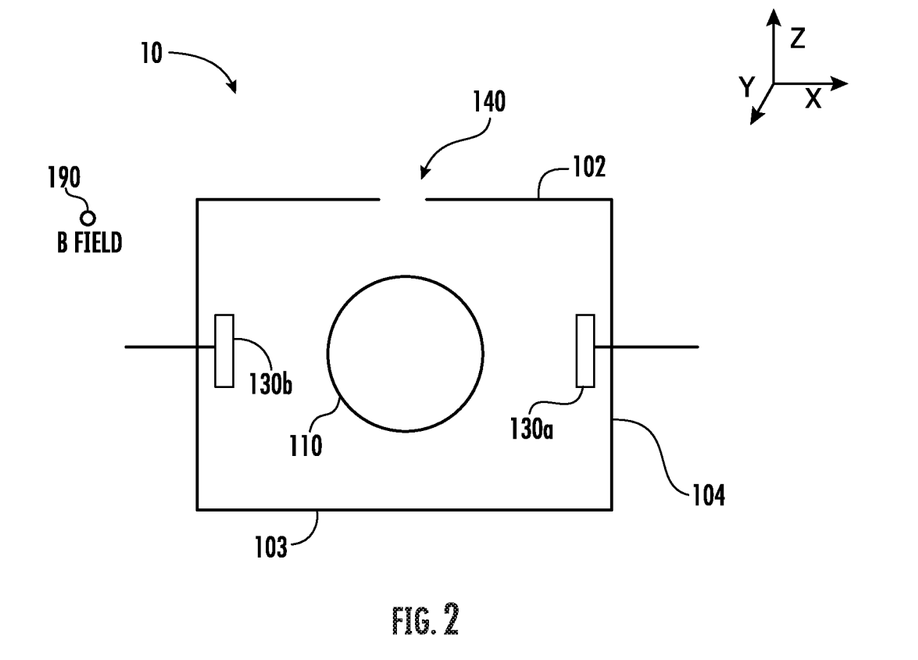
FIG. 2 is a cross-sectional view of the ion source of FIG. 1.

As described above, the optimal voltages that are to be applied to the various components within an ion source may vary depending on the feed gas that is used. Unexpectedly, it has been found that the application of negative bias voltages to the side electrodes may improve fractionalization for certain species. FIG. 1 shows an ion source 10 that allows the side electrodes to be negatively biased relative to the chamber walls in certain embodiments. FIG. 2 shows a cross-sectional view of the ion source 10 of FIG. 1.

The ion source 10 may be an indirectly heated cathode (IHC) ion source. The ion source 10 includes a chamber 100, comprising two opposite ends, and walls 101 connecting to these ends. These walls 101 include side walls 104, an extraction plate 102 and a bottom wall 103 opposite the extraction plate 102. The walls 101 of the chamber 100 may be constructed of an electrically conductive material and may be in electrical communication with one another. In certain embodiments, all of the walls 101 are electrically conductive. In other embodiments, at least one wall 101 is electrically conductive. A cathode 110 is disposed in the chamber 100 at a first end 105 of the chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. Additionally, the cathode 110 is electrically connected to the arc power supply 175. The positive terminal of the arc power supply 175 may be electrically connected to the walls 101, such that the output from the arc power supply 175 is negative with respect to the walls 101. In this wall, the cathode 110 is maintained at a negative voltage relative to the chamber 100. In certain embodiments, the cathode 110 may be biased at between −30V and −150V relative to the chamber 100.

In certain embodiments, the electrically conductive walls of the chamber 100 is connected to electrical ground. In certain embodiments, the walls 101 provide the ground reference for the other power supplies.

In this embodiment, a repeller 120 is disposed in the chamber 100 on the second end 106 of the chamber 100 opposite the cathode 110. As the name suggests, the repeller 120 serves to repel the electrons emitted from the cathode 110 back toward the center of the chamber 100. For example, in certain embodiments, the repeller 120 may be biased at a negative voltage relative to the chamber 100 to repel the electrons. For example, in certain embodiments, the repeller 120 is biased at between −30V and −150V relative to the chamber 100. In these embodiments, the repeller 120 may be in electrical communication with the arc power supply 175, as shown in FIG. 1. In other embodiments, the repeller 120 may be floated relative to the chamber 100. In other words, when floated, the repeller 120 is not electrically connected to a power supply or to the chamber 100. In this embodiment, the voltage of the repeller 120 tends to drift to a voltage close to that of the cathode 110. Alternatively, the repeller 120 may be electrically connected to the walls 101.

In certain embodiments, a magnetic field 190 is generated in the chamber 100. This magnetic field is intended to confine the electrons along one direction. The magnetic field 190 typically runs parallel to the side walls 104 from the first end 105 to the second end 106. For example, electrons may be confined in a column that is parallel to the direction from the cathode 110 to the repeller 120 (i.e. the y direction). Thus, electrons do not experience electromagnetic force to move in the y direction. However, movement of the electrons in other directions may experience an electromagnetic force.

In the embodiment shown in FIG. 1, first side electrode 130a and second side electrode 130b may be disposed on side walls 104 of the chamber 100, such that the side electrodes are within the chamber 100. The side electrodes 130a, 130b may be U-shaped or tubular shaped to surround the plasm. The side electrodes 130a, 130b may each be in electrical communication with the electrode power supply 177. The positive terminal of the electrode power supply 177 may be electrically connected to the walls 101, such that the output from the electrode power supply 177 is negative with respect to the walls 101. The electrode power supply 177 may be programmable. In other words, the output voltage of the electrode power supply 177 may be programmable, such as via controller 180.

In FIG. 2, the cathode 110 is shown against the first end 105 of the ion source 10. First side electrode 130a and second side electrode 130b are shown on opposite side walls 104 of the chamber 100. The magnetic field 190 is shown directed out of the page, in the Y direction. In certain embodiments, the side electrodes 130a, 130b may be separated from the side walls 104 of the chamber 100 through the use of insulators or vacuum gaps. Electrical connections from the electrode power supply 177 may be made to the first side electrode 130a and the second side electrode 130b by passing a conductive material from the exterior of the chamber 100 to the respective side electrode.

Each of the cathode 110, the repeller 120, the first side electrode 130a and the second side electrode 130b is made of an electrically conductive material, such as a metal. Each of these components may be physically separated from the walls 101, so that a voltage, different from ground, may be applied to each component.

Disposed on the extraction plate 102, may be an extraction aperture 140. In FIG. 1, the extraction aperture 140 is disposed on a side that is parallel to the X-Y plane (parallel to the page). Further, while not shown, the ion source 10 also comprises a gas inlet through which the feed gas to be ionized is introduced to the chamber 100. The feed gas may be any desired species, including, but not limited to, a boron-based feed gas, such as boron trifluoride ($BF_3$) or $B_2F_4$ or an arsenic-based feed gas, such as arsine ($AsH_3$).

A controller 180 may be in communication with one or more of the power supplies such that the voltage or current supplied by these power supplies may be modified by the controller 180. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

The controller 180 may be used to supply control signals to the electrode power supply 177 and one or more of the other power supplies, such as arc power supply 175, cathode bias power supply 115 and filament power supply 165 so as to vary their respective outputs. In certain embodiments, the controller 180 may have an input device 181, such as a keyboard, touch screen or other device. An operator may utilize this input device 181 to inform the controller 180 of the desired output voltage for each power supply. In other embodiments, the operator may select a desired feed gas and the appropriate output voltage of each power supply for this feed gas may be automatically configured by the controller 180.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the chamber 100. These electrons collide with the molecules of gas that are fed into the chamber 100 through the gas inlet. These collisions create positive ions, which form a plasma 150. The plasma 150 may be confined and manipulated by the electrical fields created by the cathode 110, the repeller 120, the first side electrode 130a and the second side electrode 130b. Further, in certain embodiments, the electrons and positive ions may be somewhat confined by the magnetic field 190. In certain embodiments, the plasma 150 is confined near the center of the chamber 100, proximate the extraction aperture 140.

Unexpectedly, it has been found that a negative voltage applied to the side electrodes 130a, 130b may increase fractionalization of certain feed gasses. Specifically, without being bound to any particular theory, it is believed that the negatively biased side electrodes 130a, 130b repel the electrons in the plasma 150 away from the sides and toward the center of the chamber 100, where more collisions may occur with the feed gas. This enhanced confinement of the electrons may explain the increased fractionalization of certain species. In contrast, when the side electrodes 130a, 130b are grounded, the electrons may be lost to the electrodes or to the chamber 100 as the electrons from the plasma 150 are drawn to these surfaces.

In certain embodiments, a voltage of between 0V and −50V may be applied to the side electrodes 130a, 130b. In certain embodiments, the voltage may be between −5V and −50V. In certain embodiments, the voltage may be between −5V and −30V. In certain embodiments, the voltage may be between −8V and −30V. In each of these embodiments, a negative voltage may be applied to the cathode 110 by the arc power supply 175.

It was found that fractionalization of boron is enhanced by the application of a negative voltage to the side electrodes 130a, 130b. However, fractionalization of other species, such as arsenic, is not enhanced by the application of a negative voltage. Rather, for these species, it has been found that fractionalization is maximized when the side electrodes 130a, 130b are at the same voltage as the chamber 100.

Thus, in certain, embodiments, the controller 180 is in communication with the electrode power supply 177. The controller 180 may receive an input from a user or operator that indicates which feed gas is being introduced into the chamber 100. Based on the desired feed gas, the controller 180 may program the electrode power supply 177 so as to output the desired voltage. As stated above, in certain embodiments, the desired output voltage may be 0V, such as in the case of arsenic-based feed gasses, such as arsine. In other embodiments, the desired output voltage may be between −5V and −50V, and more particularly between −8V and −30V, such as in the case of boron-based feed gasses, such as boron trifluoride. Thus, the controller sets the output voltage of the electrode power supply 177 to 0V relative to the chamber when a first species, such as arsine, is selected by the user. The controller sets the output voltage of the electrode power supply 177 to a negative voltage when a second species, such as boron trifluoride, is selected by the user. This negative voltage may be between −5V and −50V relative to the chamber in certain embodiments. In other embodiments, the negative voltage may be between −8V and −30V. In certain embodiments, the negative voltage is selected such that the fractionalization is at least 15% greater than it is when the output of the electrode power supply 177 is 0V. In another embodiment, the controller 180 may receive an input from the user or operator regarding the desired voltage to be supplied by the electrode power supply 177. In this embodiment, the controller 180 simply sets the desired output voltage.

In addition, the ion source is operable with more than two species. For example, the ionization of a third species may be optimized by supplying a negative voltage that is different from the voltage supplied for the first species or the second species. In this embodiment, the controller 180 may set the output voltage of the electrode power supply 177 to a third voltage.

Figure 3:
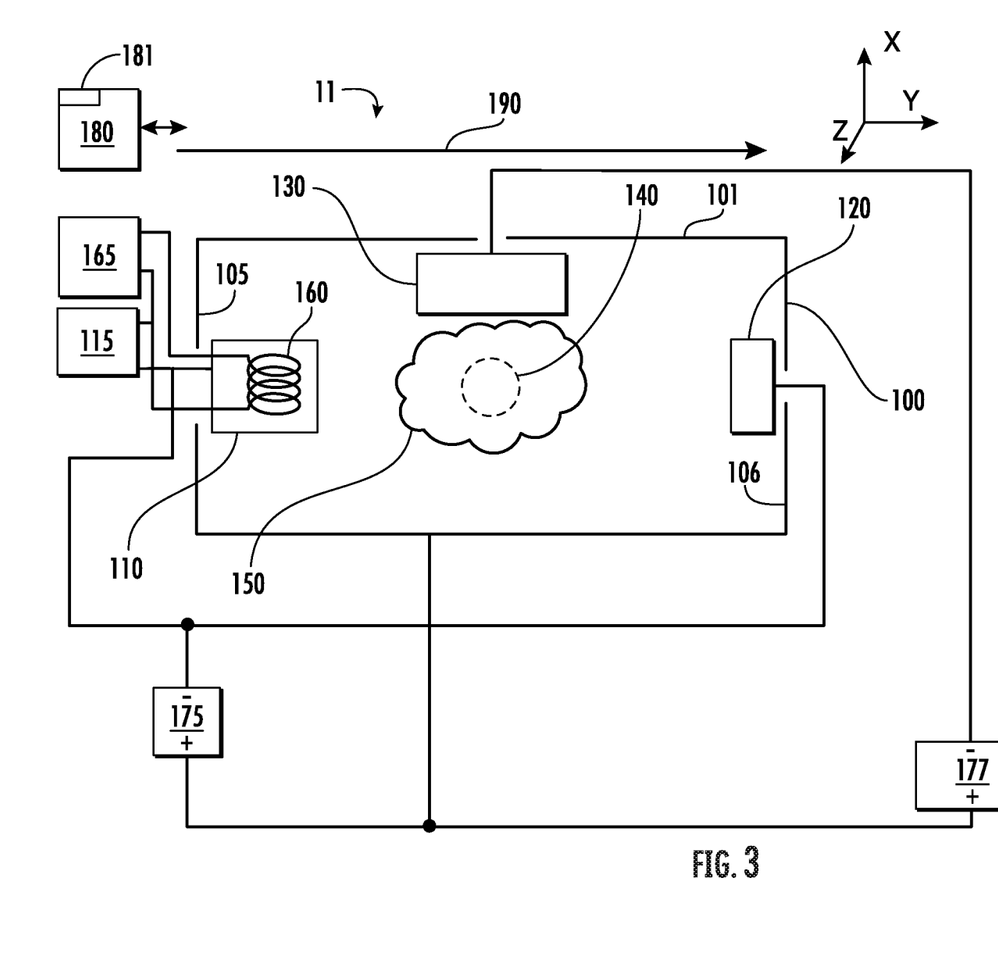
FIG. 3 is an ion source in accordance with a second embodiment.

While the above disclosure describes an IHC ion source having two side electrodes, 130a, 130b, the disclosure is not limited to this embodiment. For example, FIG. 3 shows another IHC ion source 11 which has one side electrode 130. The side electrode 130 is in communication with the electrode power supply 177. The application of voltages to this side electrode 130 may be the same as described above. All other aspect of this IHC ion source 11 are the same as was described above.

Figure 4:
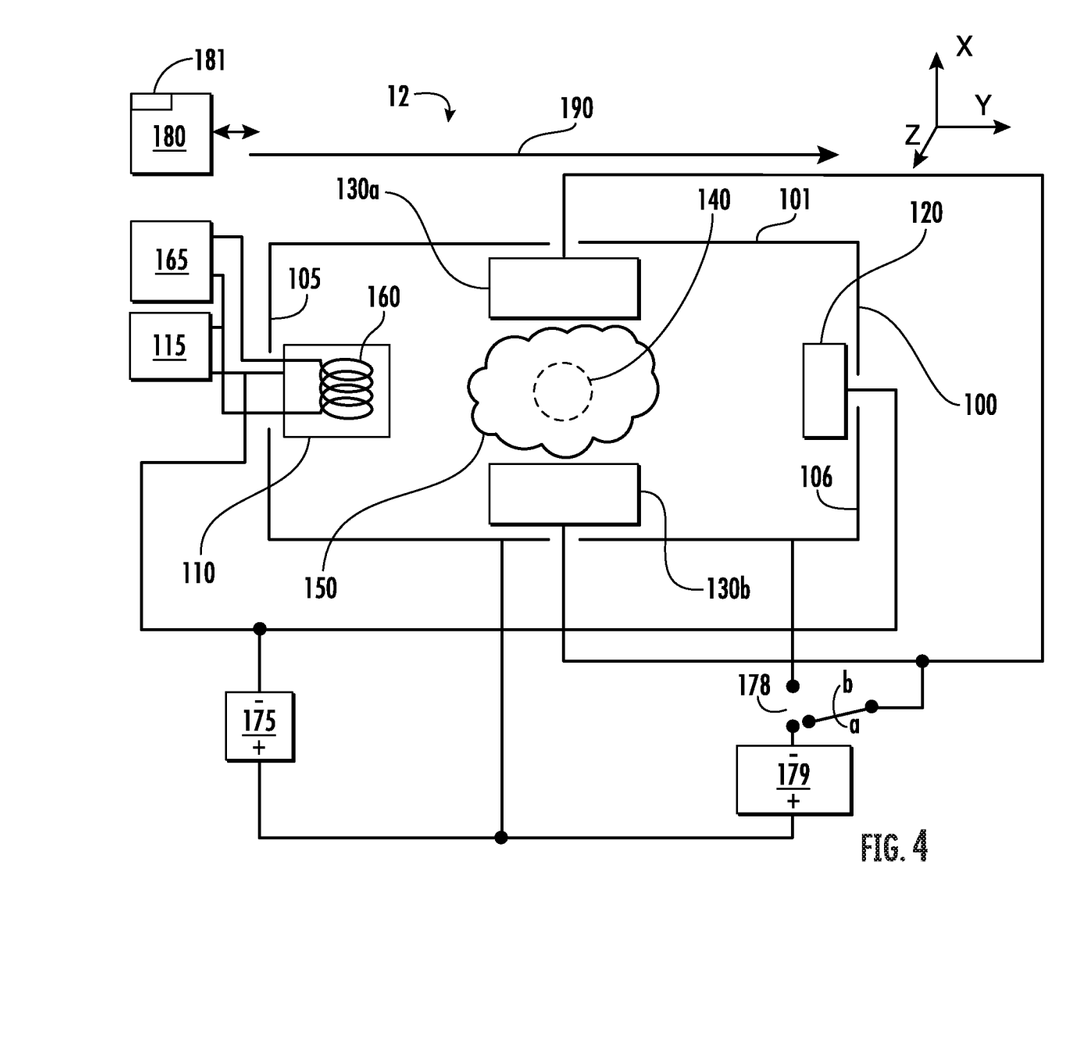
FIG. 4 is an ion source according to another embodiment.

While the above disclosure describes an electrode power supply 177 having a programmable output voltage, the disclosure is not limited to this embodiment. FIG. 4 shows another embodiment of the ion source 12 where the electrode power supply 179 outputs a constant negative voltage. This negative voltage may be between −5V and −50V relative to the chamber in certain embodiments. In other embodiments, the negative voltage may be between −8V and 30V.

To switch between the negative voltage and ground, a switch 178 is used. The switch 178 may be a single pole, double throw switch. In certain embodiments, the switch 178 may be a relay. The switch has two inputs and one output. The first input is in electrical communication with the electrode power supply 179. The second input is in electrical communication with the chamber 100. The output of the switch 178 is in electrical communication with the side electrodes 130a, 130b. When the switch 178 is in the position labeled "a" in FIG. 4, the side electrodes 130a, 130b are negatively biased using electrode power supply 179. When the switch 178 is in the position labelled "b" in FIG. 4, the side electrodes 130a, 130b are grounded. In some embodiments, the switch 178 has a select signal. The controller 180 may provide an output to this select signal to select between the two positions. Thus, in this embodiment, the controller 180 may provide an output to select the first position, where the electrode power supply 179 is connected to the side electrodes when a first species is selected. Additionally, the controller 180 may provide an output to select the second position, where the chamber 100 is connected to the side electrodes when a second species is selected. The controller 180 may select the first position when a first species, such as a boron-based feed gas, is selected. The controller 180 may select the second position when a second species, such as an arsenic-based feed gas, is selected.

While FIG. 4 shows an ion source 12 using two side electrodes 130a, 130b, it is understood that this embodiment may also be applicable to ion sources having a single side electrode, such as that shown in FIG. 3.

Furthermore, while the above disclosure is described with respect to an IHC ion source, the disclosure is not limited to this embodiment. For example, the ion source may be a Bernas ion source. A Bernas ions source is similar to an IHC ion source, but lacks a cathode (filament acts as cathode). In other words, thermionic electrons are emitted directly from the filament into the chamber and these electrons are used to energize the plasma. Alternatively, the configuration circuit may be used with a Calutron ion source, which is similar to a Bernas ion source, but lacks a repeller. Similarly, the present disclosure is also applicable to a Freeman ion source, where the filament extends from one end of the ion source to the opposite end.

The embodiments described above in the present application may have many advantages. By electrically connecting the side electrodes to a negative power supply, the voltage that is supplied to the side electrodes may be easily manipulated and optimized, based on the feed gas. In one test, the side electrodes of the ion source were grounded to the chamber walls and boron trifluoride was introduced into the chamber. The feed gas was introduced at 4.75 sccm, with an additional 0.80 sccm of a diluent gas (hydrogen). The output current was set to 40 mA. It was found that the 14.8 mA of the total beam current was singly charged boron ions (i.e. $B^+$), as measured using Faraday cups. This implies a boron fractionalization of about 37%. The side electrodes were then biased at −10V relative to the chamber walls and the test was repeated with all other parameters left unchanged. In this second test, it was found that 17.8 mA of the total beam current was singly charged boron ions. This implies a boron fractionalization of 44.5%. Thus, an increase in boron fractionalization of 20% was achieved by negatively biasing the side electrodes. In contrast, it was found that, when arsine was used as the feed gas, arsenic fractionalization was optimized by setting the output of the electrode power supply to 0 voltage. The use of a negatively biased power supply in communication with the side electrodes allows these changes to be easily implemented.

Further, increased fractionalization implies more dopant beam current. Currently, the fabrication of improved power device, such as those used in electric cars, uses more beam current at medium energies such as 250 keV in order to perform high dose implants, where the dose may be 5 $E15/cm^2$ or greater.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
a chamber, comprising at least one electrically conductive wall;
a cathode disposed on one end of the chamber;
a first side electrode disposed on one side wall;
an arc power supply to bias the cathode at a negative voltage relative to the electrically conductive wall;
an electrode power supply to bias the first side electrode, where an output of the electrode power supply is between 0 and −50V relative to the electrically conductive wall; and
a controller in communication with the electrode power supply, wherein the controller varies the output of the electrode power supply based on a feed gas that is used, such that controller sets the output of the electrode power supply to 0V if an arsenic-based feed gas is used.

2. The ion source of claim 1, further comprising a second side electrode disposed on a second side wall, wherein the second side electrode is in communication with the electrode power supply.

3. The ion source of claim 1, further comprising a repeller disposed on an opposite end of the chamber.

4. An ion source, comprising:
a chamber, comprising at least one electrically conductive wall;
a cathode disposed on one end of the chamber;
a first side electrode disposed on one side wall;
an arc power supply to bias the cathode at a negative voltage relative to the electrically conductive wall; and
an electrode power supply to bias the first side electrode, where an output of the electrode power supply is between 0 and −50V relative to the electrically conductive wall;
a controller in communication with the electrode power supply, wherein the controller varies the output of the electrode power supply based on a feed gas that is used, such that the controller sets the output of the electrode power supply to a value between −5V and −50V if a boron-based feed gas is used.

5. The ion source of claim 4, wherein the controller sets the output of the electrode power supply to a value between −8V and −30V if a boron-based feed gas is used.

6. The ion source of claim 4, wherein the controller sets the output of the electrode power supply to a value such that boron fractionalization is at least 15% greater than the boron fractionalization is when the output of the electrode power supply is 0V.

7. The ion source of claim 4, further comprising a second side electrode disposed on a second side wall, wherein the second side electrode is in communication with the electrode power supply.

8. The ion source of claim 4, further comprising a repeller disposed on an opposite end of the chamber.

9. An ion source, comprising:
- a chamber, comprising at least one electrically conductive wall;
- a cathode disposed on one end of the chamber;
- a first side electrode disposed on one side wall;
- an arc power supply to bias the cathode at a negative voltage relative to the electrically conductive wall;
- an electrode power supply to bias the first side electrode; and
- a controller, comprising an input device through which an operator may enter a desired feed gas, and wherein the controller controls an output of the electrode power supply, such that the output is 0V when an arsenic-based feed gas is selected, and the output is a negative voltage, between −5V and −50V relative to the electrically conductive wall, when a boron-based feed gas is selected.

10. The ion source of claim 9, wherein the negative voltage is between −8V and −30V relative to the electrically conductive wall.

11. The ion source of claim 9, further comprising a second side electrode disposed on a second side wall, wherein the second side electrode is in communication with the electrode power supply.

12. The ion source of claim 9, further comprising a repeller disposed on an opposite end of the chamber.

13. An ion source, comprising:
- a chamber, comprising at least one electrically conductive wall;
- a cathode disposed on one end of the chamber;
- a first side electrode disposed on one side wall;
- an arc power supply to bias the cathode at a negative voltage relative to the electrically conductive wall;
- an electrode power supply to bias the first side electrode, wherein the electrode power supply supplies a negative voltage between −5V and −50V relative to the electrically conductive wall;
- a switch having two inputs and an output, wherein a first input is in communication with the electrically conductive wall, a second input is in communication with the electrode power supply, and the output is in communication with the first side electrode, such that in a first position, the first side electrode is in electrical communication with the electrode power supply and in a second position, the first side electrode is in electrical communication with the electrically conductive wall; and
- a controller in communication with a select signal of the switch such that the controller selects the first position when a boron-based feed gas is used and selects the second position when an arsenic-based feed gas is used.

14. The ion source of claim 13, further comprising a second side electrode disposed on a second side wall, wherein the second side electrode is in communication with the electrode power supply.

15. The ion source of claim 13, further comprising a repeller disposed on an opposite end of the chamber.

16. The ion source of claim 13, wherein the electrode power supply supplies a negative voltage between −8V and −30V relative to the electrically conductive wall.

* * * * *